United States Patent
Oda

(10) Patent No.: US 6,831,692 B1
(45) Date of Patent: Dec. 14, 2004

(54) SOLID-STATE IMAGE PICKUP APPARATUS CAPABLE OF OUTPUTTING HIGH DEFINITION IMAGE SIGNALS WITH PHOTOSENSITIVE CELLS DIFFERENT IN SENSITIVITY AND SIGNAL READING METHOD

(75) Inventor: Kazuya Oda, Asaka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/414,003

(22) Filed: Oct. 7, 1999

(30) Foreign Application Priority Data

Oct. 12, 1998 (JP) .......................................... 10-289052

(51) Int. Cl.[7] ........................ H04N 5/335; H04N 5/217; H01L 27/148; H01L 27/00
(52) U.S. Cl. ....................... 348/315; 348/275; 348/241; 257/232; 250/208.1
(58) Field of Search ................................ 348/272, 275, 348/281, 282, 394, 340, 279, 280, 294–324, 241; 257/232–234; 250/208.1; 358/482, 483

(56) References Cited

U.S. PATENT DOCUMENTS

| | | | | |
|---|---|---|---|---|
| 4,558,365 A | * | 12/1985 | Ochi | 348/275 |
| 4,574,311 A | * | 3/1986 | Resnikoff et al. | 348/315 |
| 4,602,289 A | * | 7/1986 | Sekine | 348/315 |
| 5,274,476 A | * | 12/1993 | Lee | 257/232 |
| 5,345,099 A | * | 9/1994 | Yamada | 257/232 |
| 5,703,641 A | * | 12/1997 | Watanabe | 348/272 |
| 6,211,915 B1 | * | 4/2001 | Harada | 348/314 |
| 6,236,434 B1 | * | 5/2001 | Yamada | 348/315 |
| 6,522,356 B1 | * | 2/2003 | Watanabe | 348/275 |

FOREIGN PATENT DOCUMENTS

| | | |
|---|---|---|
| JP | A677450 | 3/1994 |
| JP | 06077450 | 3/1994 |
| JP | B2834558 | 3/1996 |
| JP | A10136391 | 5/1998 |

* cited by examiner

Primary Examiner—Andrew Christensen
Assistant Examiner—Nhan Tran
(74) Attorney, Agent, or Firm—Birch, Stewart, Kolasch & Birch, LLP

(57) ABSTRACT

A solid-state image pickup apparatus includes color separating filters for separating incident light representative of a scene into color components. Photosensitive cells are arranged in rows and columns each for receiving a particular color component and outputting a corresponding signal charge. The photosensitive cells are classified into a first and a second group respectively having first sensitivity and second sensitivity lower than the first sensitivity. The photosensitive cells of the first group adjoin the photosensitive cells of the second group with their geometric centers being shifted from those of the photosensitive cells of the second group by one half of a pitch with respect to arrangement in the direction of rows and/or the direction of columns. A first transfer path extends in the direction of columns between each nearby photosensitive cells of the first group adjoining each other in the direction of rows for transferring signal charges output from the photosensitive cells. A second transfer path extends in the direction of columns between each nearby photosensitive cells of the second group adjoining each other in the direction of rows for transferring signal charges output from the photosensitive cells. A signal reading device feeds the signal charges to the first and second transfer paths. A third transfer path extends in the direction of rows for transferring the signal charges input via the first and second transfer paths. A signal combining circuit adjusts the saturation level of signals derived from the photosensitive cells of the first group and then combines then and signals derived from the photosensitive cells of the second group.

20 Claims, 8 Drawing Sheets

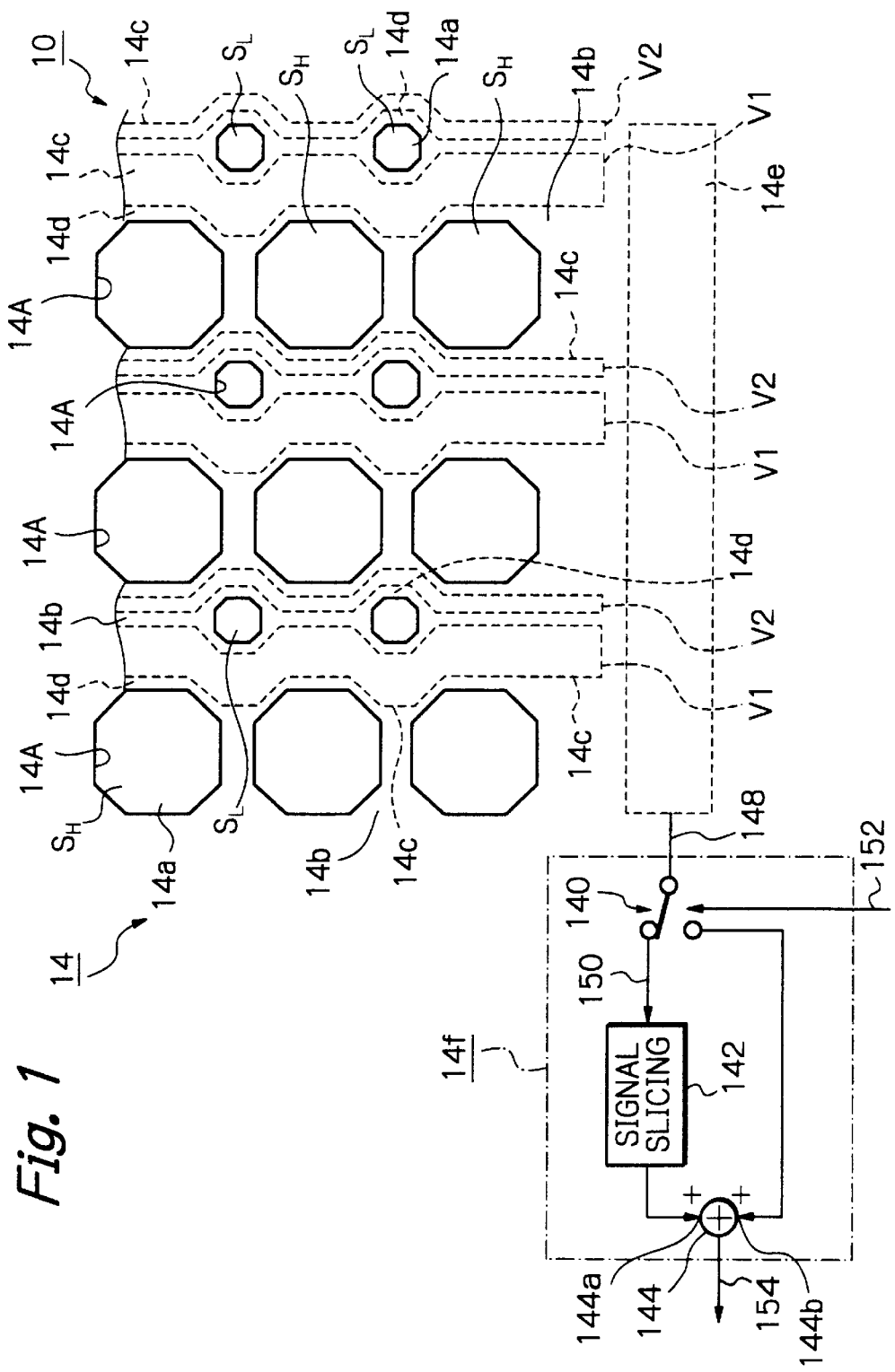

SOLID-STATE IMAGE PICKUP APPARATUS CAPABLE OF OUTPUTTING HIGH DEFINITION IMAGE SIGNALS WITH PHOTOSENSITIVE CELLS DIFFERENT IN SENSITIVITY AND SIGNAL READING METHOD

BACKGROUND OF THE INVENTION

1. Field of the Invention

The present invention relates to a solid-state image pickup apparatus capable of outputting high definition image signals with photosensitive cells different in sensitivity, and a signal reading method. The present invention is advantageously applicable to a digital still camera, movie camera, image input unit or similar imaging equipment of the type transforming incident light to a corresponding electric signal by photoelectric transduction.

2. Description of the Background Art

A video camera, for example, using a solid-state image pickup apparatus has a problem that a dynamic range to the intensity of incident light available with the camera is narrow. Specifically, even when light incident to the image pickup apparatus has intensity higher than preselected one, the dynamic range has an upper limit defined by the saturation level of photosensitive cells included in the image pickup apparatus. The dynamic range must have a lower limit surely providing a signal derived from incident light with an S/N (Signal-to-Noise) ratio higher than preselected one. To broaden the dynamic range, the sensitivity of the photosensitive cells and therefore the signal level may be lowered for obviating saturation. A decrease in sensitivity, however, causes the lower limit of the dynamic range to rise and eventually reduces the dynamic range because the noise level remains the same without regard to the sensitivity, i.e., because the S/N ratio decreases. Consequently, the dynamic range of the conventional camera cannot essentially be broadened.

In light of the above, Japanese patent publication No. 34558/1996 proposes a video camera constructed to convert the intensity of incident light to an electric signal with a high S/N ratio over a broad range. The video camera taught in this document has an image pickup section including photosensitive cells having low-sensitivity and photosensitive cells having high-sensitivity. The outputs of such two different groups of photosensitive cells are subjected to level conversion and then compared with a reference voltage so as to instantaneously select an output having either one of different levels. With this configuration, the video camera broadens the dynamic range available with the photoelectric conversion of incident light to a noticeable degree.

More specifically, in the above video camera, the low-sensitivity photosensitive devices or cells and high-sensitivity photosensitive devices or cells are arranged on odd rows and even rows, respectively. However, apart from the demand for a broader dynamic range, a signal output from the image pickup section of the camera has a particular pixel pitch in each of the horizontal and vertical directions, i.e., involves spatial anisotropy due to the configuration of an aperture. This brings about a problem in the aspect of horizontal and vertical resolution and false signals.

Moreover, the above video camera causes signals to be vertically transferred line by line. That is, the outputs of the low-sensitivity photosensitive cells and those of the high-sensitivity photosensitive cells are vertically transferred to a horizontal transfer register independently of each other. When such two different outputs are combined by the horizontal transfer register, irregularity in saturation ascribable to irregularity in the performance of the high-sensitivity photosensitive cells appear in the portions of the resulting image corresponding to the above photosensitive cells, degrading image quality. It is therefore difficult to enhance image quality with the state-of-the-art video camera.

On the other hand, in the high integration aspect, a solid-state image pickup apparatus having photosensitive cells arranged in a so-called honeycomb pattern or array has recently bee proposed. In the honeycomb pattern, nearby photosensitive cells have their geometrical centers shifted by half a pitch in both of the direction of rows and the direction of columns. Japanese patent laid-open publication No. 77450/1994, for example, teaches a solid-state image pickup apparatus including photosensitive cells each of which is provided with a square shape (a specific form of rhomb) and having sides angled by 45° with respect to the vertical direction. This kind of configuration increases the aperture ratio and thereby miniaturizes the apparatus. In addition, microlenses are associated one-to-one with the photosensitive cells for promoting efficient condensation.

Further, Japanese patent laid-open publication No. 13639/1998 discloses an arrangement including charge transfer devices arranged in two columns between each nearby photoelectric transduction devices belonging to the same row. The charge transfer devices are shifted from each other by substantially one half of the distance between the adjoining rows of the transduction devices. One of the above two columns extends in a zigzag line for transferring charges output from obliquely adjoining transduction devices. With this arrangement, it is possible to enhance the high integration of the transduction devices and efficient light receipt while allowing a minimum of moire and other false signals to occur.

SUMMARY OF THE INVENTION

It is therefore an object of the present invention to provide a solid-state image pickup apparatus capable of implementing the high integration of an image pickup section, broadening the dynamic range of a signal output from the image pickup section, and reducing false signals and irregularity in saturation.

In accordance with the present invention, a solid-state image pickup apparatus includes color separating filters for separating incident light representative of a scene into color components. A plurality of photosensitive cells are arranged in rows and columns each for receiving a particular color component and outputting a corresponding signal charge. The photosensitive cells are classified into a first and a second group respectively having first sensitivity and second sensitivity lower than the first sensitivity. The photosensitive cells of the first group adjoin the photosensitive cells of the second group with their geometric centers being shifted from those of the photosensitive cells of the second group by one half of a pitch with respect to arrangement in the direction of rows and/or the direction of columns. A first transfer path extends in the direction of columns between each nearby photosensitive cells of the first group adjoining each other in the direction of rows for transferring signal charges output from the photosensitive cells. A second transfer path extends in the direction of columns between each nearby photosensitive cells of the second group adjoining each other in the direction of rows for transferring signal charges output from the photosensitive cells. A signal reading device feeds the signal charges to the first and second transfer paths. A third transfer path extends in the direction of rows for transferring the signal charges input via the first and second transfer paths. A signal combining circuit adjusts the saturation level of signals derived from the photosensitive cells of the first group and then combines then and signals derived from the photosensitive cells of the second group.

Also, in accordance with the present invention, a signal reading method reads signal charges output by photoelectric transduction from photosensitive cells of a first group and photosensitive cells of a second group each having particular sensitivity via a first and a second transfer path extending in the direction of columns and a third transfer path extending in the direction of rows. The photosensitive cells are arranged bidimensionally with their geometrical centers being shifted by one half of a pitch representative of a distance between the cells in at least one of the direction of columns and direction of rows. The method begins with a step of causing each of the photosensitive cells of the first group and the photosensitive cells of the second group to receive light with particular one of high-sensitivity and low-sensitivity. The signal charges of high-sensitivity and signal charges of low-sensitivity are fed to the first transfer path and second transfer path, respectively. The signal charges of high sensitivity and signal charges of low-sensitivity are sequentially transferred to the third transfer path in the direction of columns. The signal charges input to the third transfer path are transferred in the direction of rows in the form of a line or in the form of pixels corresponding to the photosensitive cells. A particular destination of the signal charges is selected for each of the high-sensitivity and low-sensitivity. When the signal charges of high-sensitivity selected are higher than a preselected level, the signal charges are sliced at the preselected level. Signals subjected to slicing and the signal charges of low-sensitivity selected are combined.

BRIEF DESCRIPTION OF THE DRAWINGS

The objects and features of the present invention will become more apparent from the consideration of the following detailed description taken in conjunction with the accompanying drawings in which:

FIG. 1 is a plan view of an image pickup section, as seen in a light incidence side, included in a solid-state image pickup apparatus embodying the present invention and a schematic block diagram showing signal processing to be executed by the image pickup section;

In the drawings, identical reference numerals designate identical structural elements.

DESCRIPTION OF THE PREFERRED EMBODIMENTS

Figure 2A:
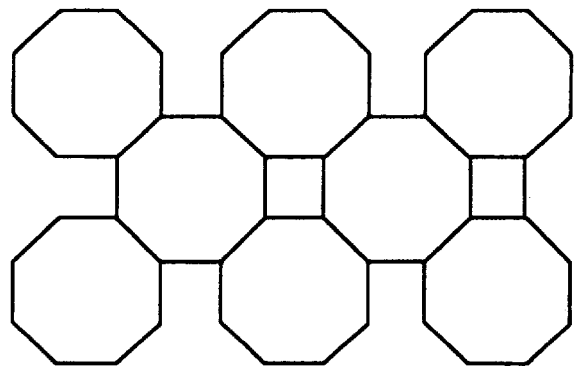
FIGS. 2A, 2B and 2C are views each showing a specific arrangement of photosensitive cells included in the illustrative embodiment.

Briefly, in accordance with the present invention, a solid-state image pickup apparatus includes two groups of photosensitive cells each having a particular degree of sensitivity or photoelectric transduction efficiency. The degrees of sensitivity are differentiated from each other in terms of the size of the sensitive area of the individual photosensitive device, i.e., the size of a cell. Image signals output from such photosensitive cells successfully broaden the dynamic range of the apparatus. In addition, the image signals are clipped in level in order to obviate irregularity in saturation. Further, the photosensitive cells are arranged in the honeycomb pattern to realize an unprecedented utilization efficiency for a given area and to reduce false signals. By obviating a difference between the color-by-color quantities of light particular to color separating means on the basis of the above difference in sensitivity, it is also possible to output an image with desirable color balance.

Referring to FIG. 1 of the drawings, a solid-state image pickup apparatus embodying the present invention is shown and generally designated by the reference numeral 10. As shown, the image pick-up apparatus 10 includes an image pickup section 14 having a plurality of photosensitive cells, which will be described specifically later, arranged bidimensionally. Optics, not shown, focuses light incident thereto and representative of a desired scene on the photosensitive cells via a preselected optical path. Color filters, not shown, are positioned in front of photosensitive cell in one-to-one correspondence for separating the incident light into color components. A color signal processing section, not shown, executes various kinds of signal processing with signals output from the image pickup section 14. Specifically, the color signal processing section includes a gamma correcting circuit, an analog-to-digital converter, and a signal processing circuit. The image pickup section or array of photosensitive cells 14 and arrangements around it characterize the illustrative embodiment. The image pickup section 14 may be implemented as an image sensor using, e.g., CCDs (Charge coupled Devices) or MOSs (Metal Oxide Semiconductors).

The image pickup apparatus 10 appears as shown in FIG. 1 when seen in the direction in which light is incident; FIG. 1 shows only part of the apparatus 10 in an enlarged scale. The image pickup section 14 includes photosensitive cells 14a, a shield member 14b, vertical transfer paths 14c, signal read gates 14d, a horizontal transfer path 14e, and an output adjusting circuit 14f.

The photosensitive cells or photosensors 14a each convert a quantity of light incident thereto to a corresponding electric signal by photoelectric transduction. More specifically, the photosensitive cells 14a, each forming a particular pixel, are arranged in the honeycomb pattern, as will be described specifically later. The shield member 14b covers the front end of the image pickup section 14 to which light is incident. Apertures 14A are formed in the shield member 14b in alignment with the photosensitive cells 14a, so that light is input to the photosensitive cells 14a via the apertures 14A.

In the illustrative embodiment, the photosensitive cells 14a do not have the same sensitivity to light, i.e., the same photoelectric transduction efficiency as each other, but have a plurality of different degrees of sensitivity to light. Photosensitive cells or photosensors produced by an identical procedure would have the same sensitivity to light. The sensitivity would differ from one photosensitive cell to another if the quantity of incident light, among others, were varied device by device. Specifically, in the illustrative embodiment, the image pickup section 14 has a first group of photosensitive cells $S_H$ whose sensitivity is higher than usual sensitivity, and a second group of photosensitive cells $S_L$ whose sensitivity is lower than the usual sensitivity. To implement the difference in sensitivity, the apertures 14A aligned with the first group of cells $S_H$ and the apertures 14A aligned with the second group of cells $S_L$ are provided with a relatively large area and a relatively small area, respectively. For example, the cells $S_L$ may have a cell size which is one half of the cell size of the cells $S_H$ and have sensitivity which is 1/20 of the sensitivity of cells $S_H$. In addition, the cell $S_L$ with low-sensitivity each saturate with a smaller amount of signal charge than the cells $S_H$ with high-sensitivity. Such an arrangement of the image pickup section 14 and the configuration of the individual photosensitive cell will be described more specifically later.

Figure 2B:
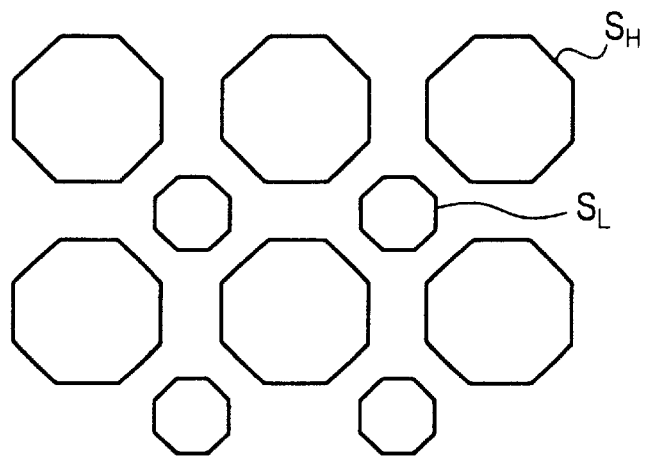
Figure 2C:
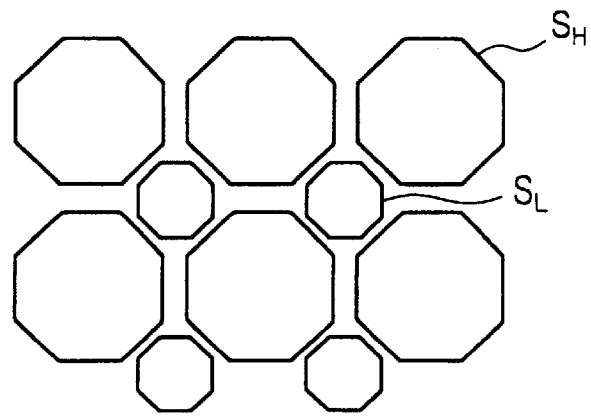

The photosensitive cells 14a having the above two different degrees of sensitivity are arranged in the honeycomb pattern. In the honeycomb pattern, nearby photosensitive cells 14a have their geometric centers shifted from each other by, e.g., one half of the distance between the cells 14a, i.e., one half of a pitch in the direction of rows (horizontal) and/or the direction of columns (vertical). Each photosensitive cell 14a has an octagonal shape produced by removing the four corners of a square lattice and generally considered to enhance the positional efficiency of the honeycomb pattern. FIG. 2A shows the photosensitive cells having the identical octagonal shape; the cells closely adjoin each other. As shown in FIG. 2B, when the photosensitive cells $S_L$ whose cell size is one half of cell size of the photosensitive cells $S_H$ are arranged in the honeycomb pattern together with the cells $S_H$; the cells $S_L$ and cells $S_H$ are spaced from each other. As shown in FIG. 2C, when the cells $S_L$ and cells $S_H$ of FIG. 2B are so arranged as to fill up the gaps between them, a more dense honeycomb arrangement is achieved. Moreover, by reducing the cell size of each cell $S_L$, it is possible to provide each cell $S_H$ with a cell size larger than the conventional cell size or to increase the number of pixels for a given area or chip size of the image pickup section 14. In addition, such a shape of each photosensitive cell 14a insures spatial isotropy without regard to the size of the cell 14a.

Referring again to FIG. 1, the vertical transfer paths 14c serve as charge coupling devices and are arranged side by side in the area covered with the shield member 14b in accordance with the configuration of the photosensitive cells 14a. In the illustrative embodiment, two vertical transfer paths 14c are present between the photosensitive cells 14a adjacent to each other in the horizontal direction. Each vertical transfer path 14c (V1) adjacent to the photosensitive cells $S_H$ has a width broad enough to accurately transfer signal charges output from the cells $S_H$ and greater in amount than signal charges output from the other photosensitive cells $S_L$. Each vertical transfer path 14c (V2) adjoining the photosensitive cells $S_L$ may have a relatively small width because of the above relation between the cells $S_H$ and $S_L$ in the amount of signal charge to transfer. This configuration of the vertical transfer paths 14c (V1 and V2) allows the limited area of the image pickup section 14 to be efficiently used. More specifically, the distance between each photosensitive cell 14a and the adjoining vertical transfer path 14c is confined in a particular range for the efficient use of the limited area of the image pickup section 14. As a result, two vertical transport paths 14c each lying in a zigzag line along the photosensitive cells 14a are formed symmetrically with respect to each vertical array of the cells 14a. A plurality of conductive electrodes 14j (see FIGS. 10A and 10B) are formed, e.g., on each vertical transport path 14c with the intermediary of an insulation film. A drive signal of particular phase is fed to each electrode 14j in accordance with the number of the electrodes 14j, so that signal charges are vertically transferred by one step toward the horizontal transfer path 14e by one cycle of drive signals.

The signal read gates, or field shift gates, 14d each implement switching at the time of transfer of signal charges from the photosensitive cells 14 associated therewith to the corresponding vertical transfer path 14c. The horizontal transfer path 14e is also a charge coupling device and horizontally transfers signal charges fed from the photosensitive cells 14a via the vertical transfer paths 14c. In the illustrative embodiment, the image pick-up section 14 includes a single horizontal transfer path 14e.

The output adjusting section 14f includes a sensitivity output selector 140, a signal slicing 142, and an output combiner 144. The sensitivity output selector 140 classifies signal charges 148 input from the horizontal transfer path 14e line by line or pixel by pixel into high-sensitivity 150 and low-sensitivity 144b. The selector 140 is implemented by a switch performing the above classification in accordance with a control signal 152 received from a controller not shown. The signal slicing 142 stores beforehand the upper limit of signal charges which can be stored, and discards signal charges above the upper limit. As a result, the signal slicing 142 outputs signal charges having high-sensitivity 144a. The signal slicing 142 may be replaced with an arrangement which uses a preselected drive voltage, subjects signal charges to a current-to-voltage (I/E) conversion, and clips voltages corresponding to currents which exceed the capacity. In such an alternative arrangement, even signal charges having low-sensitivity will be subjected to I/E conversion.

The combiner 144 combines two lines of signals, i.e., the signal charges having low-sensitivity 144b output from the sensitivity output selector 140 and the clipped signal charges having high-sensitivity 144a output from the signal slicing 142. The combiner 144 produces the resulting two lines of signal charges on its output 154. Specifically, for the line-by-line combination, a timing signal is fed to the output adjusting section 14f in order to prevent the two different lines of signal charges from being mixed up, although not shown specifically. The combiner 144 additionally includes an output amplifier 146 (see FIG. 5) for amplifying a signal.

The filters for color separation mentioned earlier are implemented by R (red) filters, G (green) filters, and B (blue) filters. The filters assigned to such three primary colors are arranged in, e.g., a conventional G vertical stripe, RB full checker pattern.

Generally, color temperature at which images are picked up most frequency is between 5,000 K and 6,000 K in terms of daylight or 6,000 K in terms of tungsten (W) light used for strobe. A sensitivity ratio S achievable at such color temperature is 0.7 for a color component R, 1 for a color component G, and 0.8 for a color component B, i.e., a relation of S(G)>S(B)>S(R) holds, as well known in the art.

In the illustrative embodiment, correction is effected in opposite relation to the above ration between R, G and B. Specifically, although the photosensitive cells $S_H$ and $S_L$ may be identical in configuration, the cells of low-sensitivity $S_L$ receive light transmitted through the G color filters having the highest sensitivity ratio S. On the other hand, the photosensitive cells of high-sensitivity $S_H$ receive light transmitted through the R and B color filters having nearly the same sensitivity ratio S. With this filter assignment, it is possible to obviate a decrease in S/N ratio ascribable to the adjustment of unbalanced color-by-color sensitivity ratios.

Figure 3:
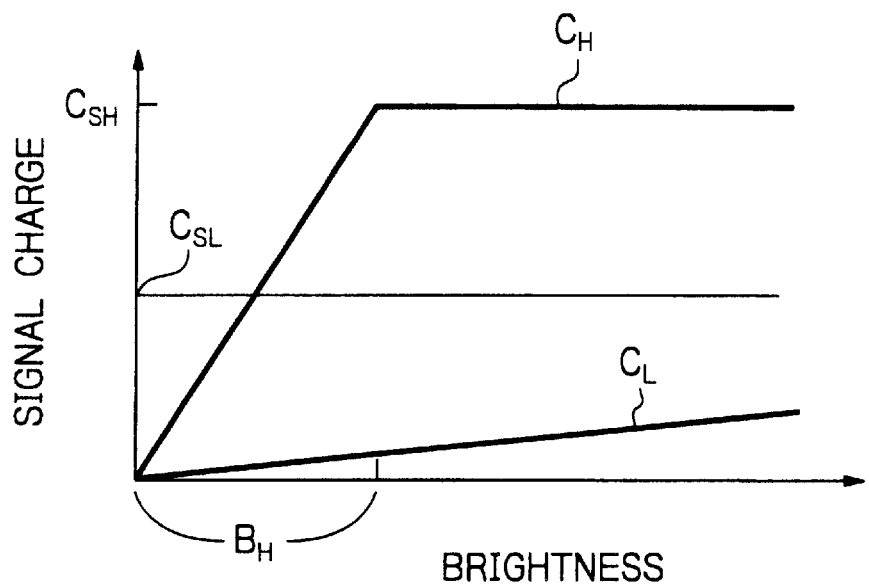
FIG. 3 is a graph comparing low-sensitivity photosensitive cells and high-sensitivity photosensitive cells included in the illustrative embodiment with respect to the amount of signal charge derived from brightness.

The image pickup apparatus 10 having the above construction will be operated as follows. The photosensitive cells 14a pick up incident light in accordance with the drive signals fed thereto. The photosensitive cells 14a are made up of the cells $S_H$ having high-sensitivity and the cells $S_L$ having low-sensitivity, as stated earlier. When an average quantity of light is radiated to both of the cells $S_H$ and $S_L$ over a preselected period of time, the quantities of light incident to the cells $S_H$ and $S_L$ differ from each other due to the difference in area between the apertures 14A. As a result, as shown in FIG. 3, a difference in the amount of signal charge produced by photoelectric transduction turns out a difference in sensitivity.

In the illustrative embodiment, as for a cell size, the photosensitive cells $S_L$ each are one half of the photosensitive cells $S_H$ in the size of each side and one-quarter of the same in the quantity of incident light. As for sensitivity, the cells $S_L$ have a gradient which is 1/20 of the gradient of the cells $S_H$. Therefore, as FIG. 3 indicates, each cell $S_H$ generates a large amount of signal charge $C_H$ even when brightness is low. In FIG. 3, the ordinate and abscissa indicate the amount of signal charge and brightness, respectively. However, the signal charge $C_H$ output from the cell reaches a saturation level ($C_{SH}$) within a narrow range of brightness $B_H$. By contrast, the signal charge $C_L$ output from each cell $S_L$ slowly increases with an increase in brightness and can therefore vary in proportion to brightness although the saturation level $C_{SL}$ of the signal charge $C_L$ is lower than the saturation level $C_{SH}$. Consequently, even when the cells $S_H$ saturate, the cells $S_L$ do not saturate. This allows the output signals of the cells $S_L$ to implement desirable image signals.

When the signal read gate 14d intervening between any one of the photosensitive cells 14a and the associated vertical transfer path 14c is opened, a signal charge stored in the device 14a is output to the transfer path 14c. Specifically, the signal read gate 14d is selectively opened or closed by a drive signal fed thereto. For example, a four-phase drive signal is applied to the signal read gates 14d via the previously mentioned conductive electrodes 14j. The four-phase drive signal causes the signal charges on the vertical transfer paths 14c to be vertically transferred toward the horizontal transfer path 14e by one step. Such vertical transfer is repeated to sequentially transfer signal charges from the vertical transfer paths 14c to the horizontal transfer path 14e stepwise. More specifically, in the configuration shown in FIG. 1, signal charges output from one row of photosensitive cells $S_H$ are transferred to the horizontal transfer path 14e first. At this instant, the portions of the horizontal transfer path 14e corresponding to the photosensitive cells $S_L$ are empty. When signal charges are vertically transferred toward the horizontal transfer path 14e by another, signal charges corresponding in position to the cells $S_L$ are fed to the horizontal transfer path 14e; the portions of the path 14e corresponding to the cells $S_H$ are empty then. In this manner, two lines of signal charges are sequentially fed to the horizontal transfer path 14e.

The horizontal transfer path 14e delivers, in response to the drive signal, the above two lines of signal charges to the output adjusting section 14f in the form of a single line or in the form of consecutive pixels. In the case of the line-by-line delivery, the sensitivity output selector 140 of the output adjusting section 14f continuously selects the signal slicing 142. At this instant, the signal slicing 142 is so conditioned as to receive and store two lines of signal charges at a time. The signal slicing 142 discards signal charges above the previously mentioned upper limit via, e.g., a sweep drain not shown. As a result, signal charges below the upper limit are fed from the signal slicing 142 to one input 144a of the output combiner 144. At this time, no signal charges are applied to the other input 144b of the output combiner 144 because the selector 140 continuously selects the signal slicing 142. The output combiner 144 therefore directly delivers the input signal charges via its output 154. It is noteworthy that the output of the signal slicing 142 has been clipped at a preselected signal charge, allowing the saturation level to remain constant.

On the other hand, in the case of the pixel-by-pixel delivery from the horizontal transfer path 14e, the sensitivity output selector 140 switches, in accordance with the control signal 152, two lines of signal charges of high-sensitivity and signal charges of low-sensitivity output to the horizontal transfer path 14e. The signal charges of high-sensitivity are fed to the signal slicing 142 while the signal charges of low-sensitivity are directly fed to the input 144b of the output combiner 144. In the case where the signal slicing 142 needs a substantial period of time for processing, a delay device, not shown, may be connected between the signal slicing 142 and the output combiner 144 in order to adjust the input timing to the output combiner 144. The output combiner 144 delivers such two lines of signals adjusted on a pixel basis via its output 154. This is also successful to obviate irregularity in the saturation of signals. Further, the delivery of signal charges from a single horizontal transfer path 14e promotes easy signal processing. If desired, the output combiner 144 may be replaced with a line memory provided at the outside of the output adjusting section 14f.

Figure 4:
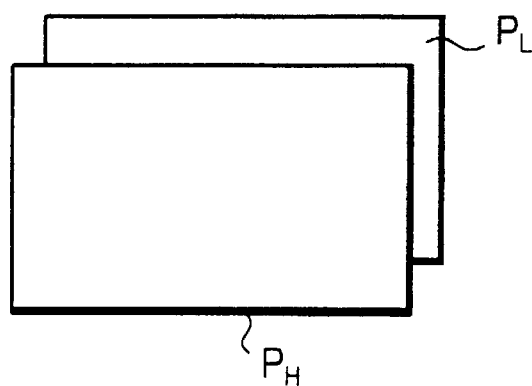
FIG. 4 is a view showing a low-sensitivity image and a high-sensitivity image available with a specific signal reading method applied to the illustrative embodiment.

Assume that the color filters are arranged in the same pattern over both of the photosensitive cells $S_H$ and $S_L$. Then, the resulting resolution is lower than resolution achievable with the honeycomb pattern. However, as shown in FIG. 4, two different pictures $P_H$ and $P_L$ different in sensitivity can be produced by a single shot only if the pixels are classified into two groups. By switching the pictures $P_H$ and $P_L$ in accordance with the quantity of incident light, the image pickup apparatus 10 is capable of outputting a picture having a broad dynamic range.

Figure 5:
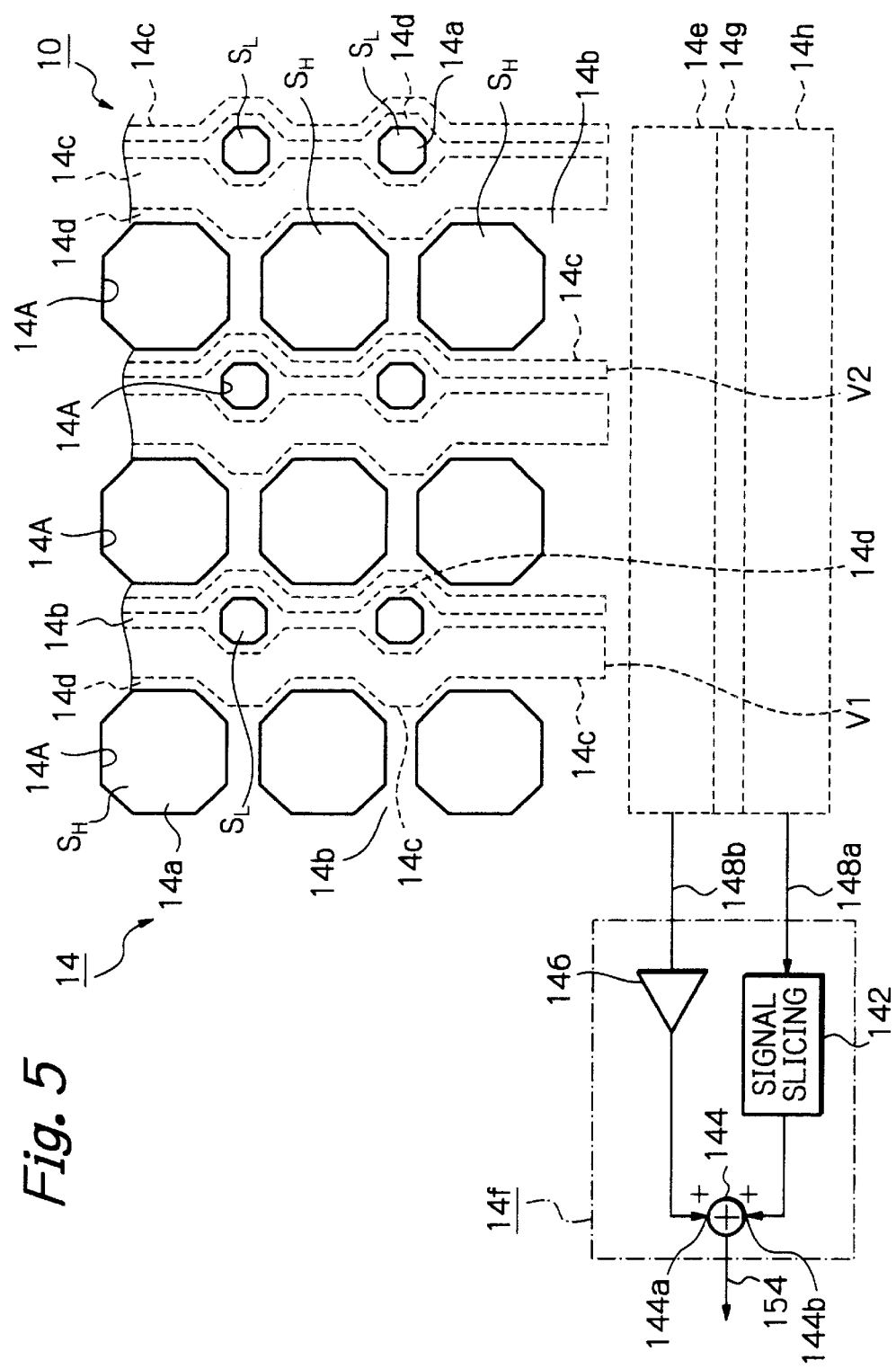
FIG. 5 is a plan view and a schematic block diagram showing a first modification of the illustrative embodiment.

A first modification of the above embodiment will be described with reference to FIG. 5. As shown, the modification includes a horizontal transfer path 14h in addition to the horizontal transfer path 14e. A skip gate 14g is positioned between the two horizontal transfer paths 14e and 14h. The horizontal paths 14e and 14h and skip gate 14g cooperate to separate signals charges of high-sensitivity and signal charges of low-sensitivity. The output adjusting section 14f therefore does not include the sensitivity output selector 140. In the specific arrangement of the photosensitive cells 14a shown in FIG. 5, the cells $S_H$ having high-sensitivity are closest to the horizontal transfer path 14e. Therefore, when signal charges are classified by sensitivity, signal charges output from the cells $S_H$ are output from the horizontal transfer path 14h. In the output adjusting section 14f, the signal slicing 142 is so positioned as to handle the output 148a of the horizontal transfer path 14. On the other hand, the output amplifier 146 adjusts the output 148*b* of the horizontal transfer path 14*e*, i.e., signal charges of low-sensitivity.

In operation, signals charges output from the photosensitive cells 14*a* are vertically transferred via the vertical transfer paths 14*c* in exactly the same manner as in the illustrative embodiment. A particular drive signal is applied to each of the vertical transfer paths 14*c* and horizontal transfer path 14*h*, although not shown specifically. First, signal charges of high-sensitivity are input to the horizontal transfer path 14*e*. Then, the drive signal applied to the skip gate 14*g* turns on the gate 14*g* and causes it to transfer the signal charges of high-sensitivity from the horizontal transfer path 14*e* to the horizontal transfer path 14*h*. Subsequently, the vertical transfer is again effected to input signal charges of low-sensitivity to the horizontal transfer path 14*e* having been evacuated. As a result, each of the horizontal transfer paths 14*e* and 14*h* stores a particular line of signal charges.

The signal charges input to the horizontal transfer path 14*h* are fed to the signal slicing 142 via the output 148*a*. Again, the signal slicing 142 discards the input signals above the upper limit and feeds the remaining signal charges to the input 144*b* of the output combiner 144. The output combiner 144 combines the signal charges input from the signal slicing 142 and the signal charges input from the horizontal transfer path 14*e* via the input 144*a* at a timing adjusted to render signal processing to follow easy to execute. The combined signal charges appear on the output 154 of the output combiner 144. This kind of procedure also allows the image pickup device 10 to effectively shoot a desired scene. Even pixel-by-pixel outputs are available with this modification only if the timing is adjusted with accuracy.

Figure 6:
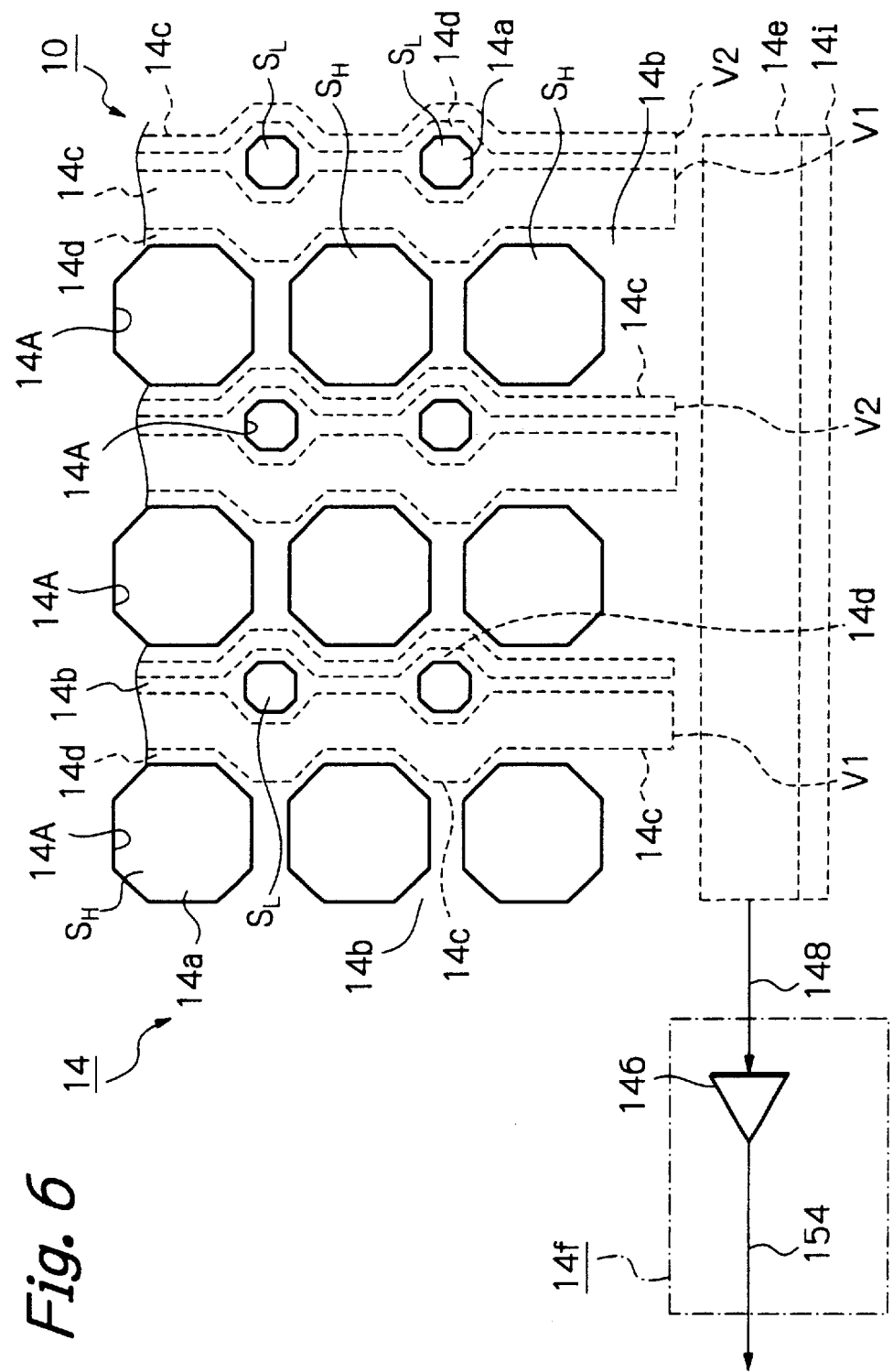
FIG. 6 is a plan view and a schematic block diagram showing a second modification of the illustrative embodiment.

FIG. 6 shows a second modification of the illustrative embodiment. As shown, this modification has a single horizontal transfer path 14*e* and a sweep drain 14*i* adjoining the path 14*e*. The output adjusting section 14*f* is implemented only by the output amplifier 146. The following description will also concentrate on a procedure to occur after the transfer of signal charges to the vertical transfer paths 14*c*. Again, signal charges of high-sensitivity are input to the horizontal transfer path 14*e*. At this instant, the potential of the drive signal applied to the horizontal transfer path 14*e* is raised to a preselected potential, thereby raising the inherent potential of the transfer path 14*e*. This is equivalent to, e.g., raising the bottom of a container for storing a liquid, i.e., reducing the capacity of the container. In this sense, assume that the saturation level of the transfer path 14*e* is subtracted from the sum of the above inherent potential and the current amount of signal charge, and that the resulting difference is positive. Then, this difference is the signal charge to overflow the transfer path 14*e*. The signal charge to overflow the transfer path 14*e* is swept via the sweep drain 14*i* in order to maintain the signal charge of high-sensitivity below a preselected amount or preselected level. Thereafter, the inherent potential of the transfer path 14*e* is restored to the original potential.

When the vertical transport paths 14*c* are again driven, signal charges of low-sensitivity are input to the horizontal transfer path 14*e*. As a result, two lines of signal charges are combined on the transfer path 14*e*. The photosensitive cells $S_L$ with low-sensitivity do not effect photoelectric transduction such that signal charges exceed the saturation amount. This, coupled with the fact that even the signal charges of high-sensitivity do not exceed the preselected upper limit, obviates irregularity in saturation and allows a plurality of pictures to be connected together without a conspicuous seam. The output 148 of the transfer path 14*e* is fed out via the output amplifier 146 of the output adjusting section 14*f*. As stated above, by implementing a single picture with signals of low-sensitivity and signals of high-sensitivity and processing the signals, the illustrative embodiment and its modifications each successfully broaden the dynamic range of the resulting picture.

Assume that the above image pickup apparatus 10 is applied to an electronic camera or similar digital imaging equipment. Then, the apparatus 10 should preferably be controlled to read signal charges in a particular manner in each of different drive modes available with the imaging equipment. As for an electronic camera, for example, the drive modes include an actual shoot mode for recording a picture picked up, a movie mode for displaying a picture picked up as a movie, an AE (Automatic Exposure) mode for calculating an adequate exposure based on a photometric value and controlling various sections to the calculated exposure, and an AF (Automatic Focus) mode for determining a distance between the camera and a subject based on the photometric value and controlling the various sections in accordance with the determined distance. In the actual shoot mode, the camera records in a recording medium signals derived from the output signals of the photosensitive cells 14*a* arranged in the honeycomb pattern and capable of displaying a picture with high resolution and desirable color balance, as will be described specifically later.

In the movie mode, the camera must display signals on its display in conformity to a rule which requires a picture to be displayed within a preselected period of time. To meet this requirement, signals are read out of either one of the photosensitive cells with low-sensitivity and photosensitive cells with high-sensitivity and displayed. For this purpose, the signal read gates 14*d* each are driven independently of the others. This halves the number of signals which should be read out of the photosensitive cells 14*a* of the image pickup section 14, compared to the case wherein all the pixels are read out. Although the resulting picture has lower resolution than the picture achievable with the actual shoot mode, the lowered resolution is negligible because the picture moves.

In the AE mode, the camera produces a photometric value by using signal charges output from the photosensitive cells having low-sensitivity. Such signal charges prevent the photometric value from being saturated. The camera can therefore surely measure a desired scene by performing photometry only once.

Further, in the AF mode, the camera should preferably use either signal charges of low-sensitivity or signal charges of high-sensitivity. Luminance information is used to implement the AF mode. Assume that the color filters are arranged in the same pattern over both of the photosensitive cells with low-sensitivity and photosensitive cells with high-sensitivity. Then, accurate photometry is achievable if only signal charges of low-sensitivity are used and if photometry is implemented only by signals derived from the G filters representative of luminance information.

Figure 7:
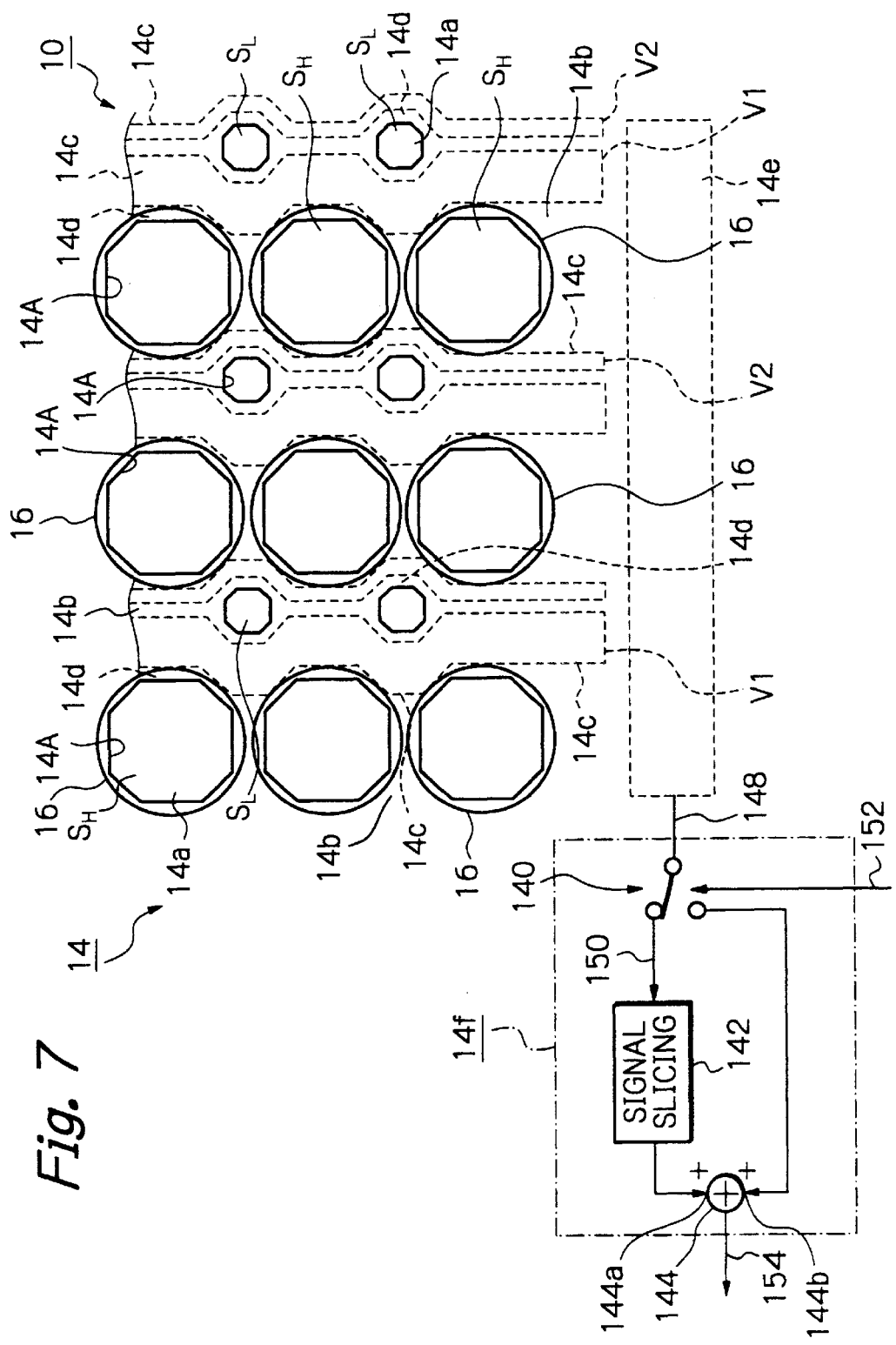
FIG. 7 is a plan view and a schematic block diagram showing an alternative embodiment of the present invention.

Referring to FIG. 7, an alternative embodiment of the present invention will be described. In the previous embodiment and its modifications, each photosensitive cell 14*a* is provided with either high-sensitivity or low-sensitivity on the basis of a cell size and its own sensitivity. The alternative embodiment to be described implements the difference in sensitivity by using a different scheme. As shown in FIG. 7, a microlens 16 is positioned on a transparent member in front of each color filter in the direction of light propagation.

The microlens 16 forms part of optics, not shown, and is aligned with the geometric center of the photosensitive cell positioned at the rear of the color filter, thereby efficiently condensing incident light.

More specifically, in the illustrative embodiment, a plurality of microlenses 16 each are assigned to one of the photosensitive cells $S_H$ having high-sensitivity in order to implement the difference in sensitivity. The microlenses 16 are defined by the radius of curvature of a condensing surface and a sectional area capable of transmitting incident light. Preferably, each microlens 16 should cover the entire shape of the associated photosensitive cell 14a. By effectively using the microlenses, the illustrative embodiment is capable of adjusting the difference in sensitivity in terms of a difference in the quantity of light. This makes it needless to provide the two groups of photosensitive cells 14a with a noticeable difference in sensitivity. Consequently, this embodiment is practicable even with photosensitive cells having the same degree of sensitivity and therefore simplifies the configuration of the image pickup section 14.

Figure 8:
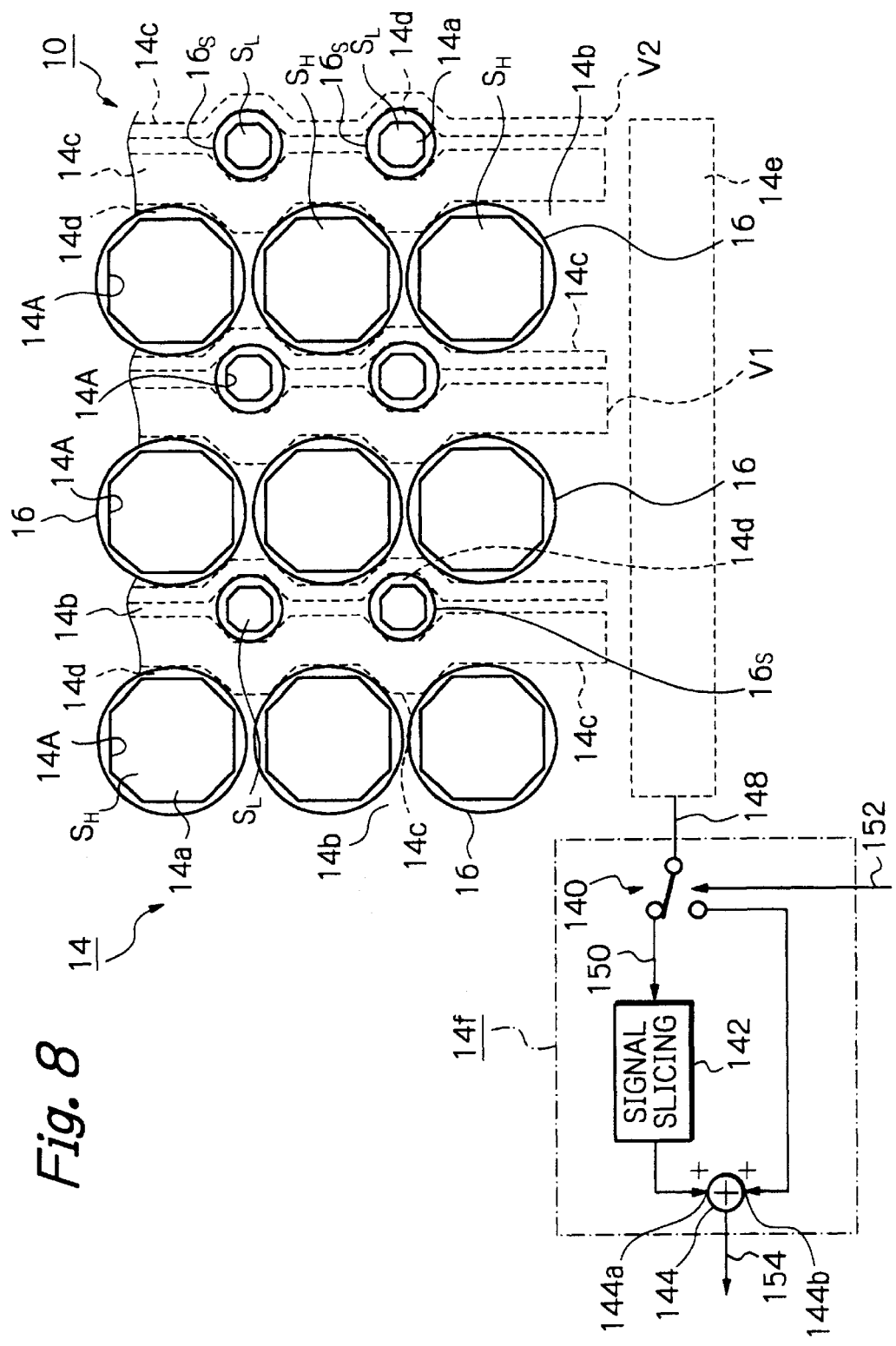
FIG. 8 is a plan view and a schematic block diagram showing a first modification of the alternative embodiment.

Reference will be made to FIG. 8 for describing a first modification of the above alternative embodiment. As shown, the image pickup apparatus 10 includes microlenses 16s in addition to the microlenses 16 aligned with the photosensitive cells $S_H$ having high-sensitivity. The microlenses 16s are respectively aligned with the photosensitive cells $S_L$ having low-sensitivity. The microlenses 16s are different in configuration from the microlenses 16. Specifically, each microlens 16s has a condensing surface different form the condensing surface of the microlens 16. For example, the microlens 16s has a radius of curvature or a sectional area for transmission smaller than that of the microlens 16, as illustrated. Such a difference also implements the difference in sensitivity between the photosensitive cells $S_H$ and $S_L$.

Figure 9:
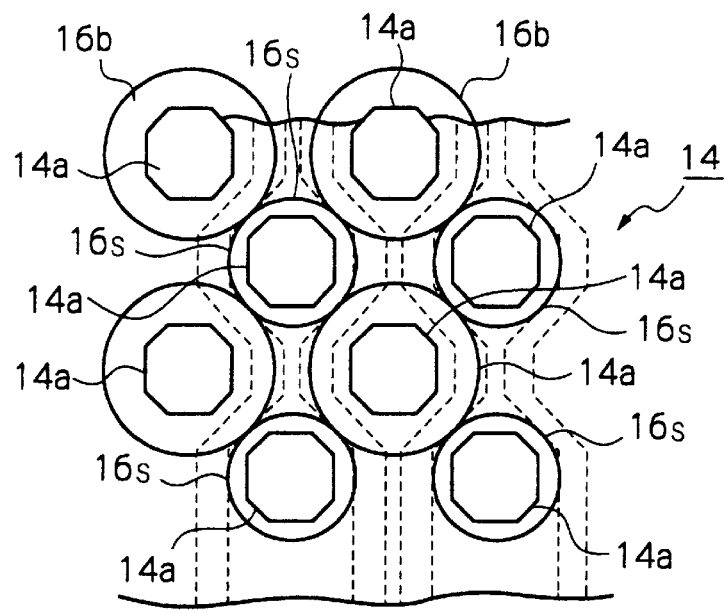
FIG. 9 is a plan view and a schematic block diagram showing a second modification of the alternative embodiment.

In the alternative embodiment and its first modification, the difference in sensitivity is implemented not only by the sensitivity of the individual photosensitive cell 14a but also the size of the device 14a, i.e., the cell size. The difference in cell size between the photosensitive cells $S_L$ and $S_H$ may be translated into a difference in the sectional area for transmission or the opening area. FIG. 9 shows a second modification of the alternative embodiment which differentiate the quantities of incident light in terms of the area. As shown, the image pickup apparatus 10 includes the microlenses 16s aligned with the photosensitive cells $S_L$ and microlenses 16b aligned with the photosensitive cells $S_H$ and having a greater size than the microlenses 16s. In this modification, all the photosensitive cells 14a are identical in cell size. The microlenses 16b are configured such that the difference in the quantity of incident light is equivalent to the difference in sensitivity.

Although the second modification slightly reduces the density of the photosensitive cells 14a, compared to the previous embodiment, it makes it needless to provide the image pickup section 14 with different kinds of photosensitive cells and therefore obviates a complicated procedure for the production of the cells 14a. If desired, a substance having a dimming function may be added to the material of the microlenses 16s in order to differentiate the quantities of light.

Figure 10A:
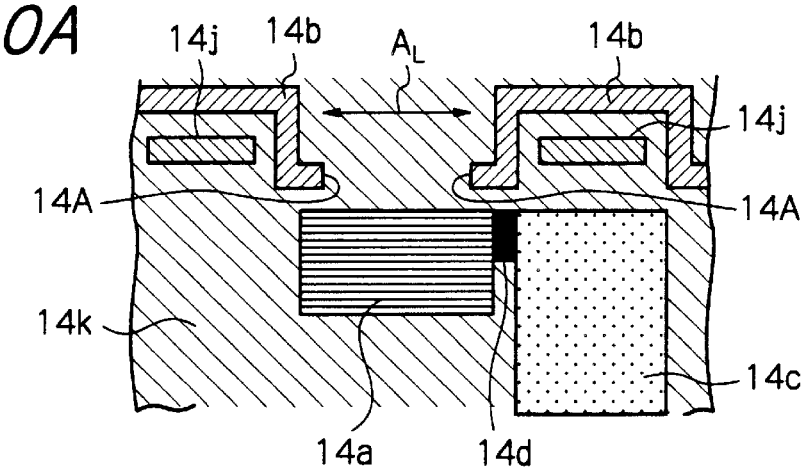
FIGS. 10A and 10B are fragmentary sectional views showing a third modification of the alternative embodiment.
Figure 10B:
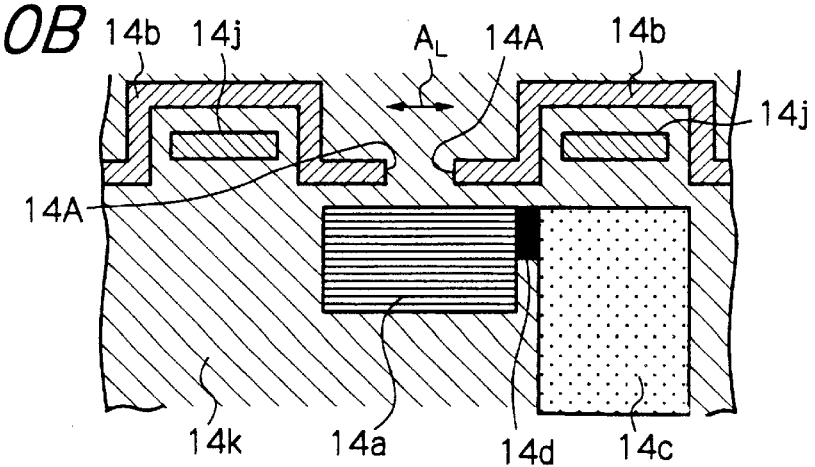

FIGS. 10A and 10B show a third modification of the alternative embodiment. This modification, like the second modification, uses the photosensitive cells 14a identical in configuration, or size, with each other. As shown, in the third modification, the shield member 14b for shielding light covers the image pickup section 14 with its apertures 14A aligning with the photosensitive cells 14a. The apertures 14A assigned to the photosensitive cells $S_H$ and the apertures 14A assigned to the photosensitive cells $S_L$ are different in aperture ratio from each other. FIGS. 10A and 10B each are a fragmentary section in a horizontal plane including the center of one photosensitive cell $S_H$ or $S_L$ although a broken line is not shown.

As shown in FIGS. 10A and 10B, the photosensitive cell 14a, shield member 14b, vertical transfer path 14c, signal read gate 14d and conductive electrodes 14j are buried in a transparent member 14k transparent for light. In FIG. 10A, the shield member 14b shielding the vertical transfer path 14c, signal read gate 14d and conductive electrodes 14j is formed with a notch indicated by a double-headed arrow AL and representative of the aperture width $W_L$ of the photosensitive cell 14a (cell). Also, in FIG. 10B, the shield member 14b is formed with a notch indicated by a double-headed arrow $A_L$ and representative of the aperture width $W_S$ which is smaller than the aperture width $W_L$.

The photosensitive cells 14a with the aperture size $W_L$ and the photosensitive cells 14a with the aperture size $W_S$ serve as the devises $S_H$ and devises $S_L$, respectively. Stated another way, the devises $S_H$ are greater in aperture ratio than the devises $S_L$. In this configuration, light is incident to each of the devises $S_H$ and $S_L$ in a particular amount, implementing the difference in sensitivity. When all the cells 14 have the same size, the period of time for the photoelectric transduction of light incident to each device 14, i.e., the exposure time may be controlled to differentiate the resulting amounts of signal charge. In such a case, the signal read gates 14b for outputting signal charges to the vertical transfer paths 14c may be controlled on a cell group basis, so that signal charges output from the consecutive cell groups can be selectively read out.

Another alternative embodiment of the present invention will be briefly described although it is not shown specifically. This embodiment, like the above alternative embodiment, differentiates the quantities of light to be incident to the photosensitive cells 14a in order to implement the difference in sensitivity. To realize the difference in the quantity of incident light, this embodiment uses the color filters in place of the microlenses 16. Specifically, the color filters aligned with the photosensitive cells 14a expected to have low-sensitivity are increased in film thickness or combined with ND (Neutral Density) filters in order to reduce the quantity of light to transmit therethrough. In this condition, the photosensitive cells 14a provided with the color filters other than the above particular filters have high-sensitivity.

Luminance information is attainable with the color filters G. For a given amount of incident light, the color G transmits a greater amount of light than the other colors R and B and therefore realizes a high photoelectric transduction ratio, as well known in the art. This, coupled with the most frequently used color temperature range of incident light (e.g. 5,000 K to 6,000 K), allows the photosensitive cells 14a for the color G and the photosensitive cells 14a for the colors R and B to be desirably dealt with as a group with low-sensitivity and a group with high-sensitivity, respectively. Then, the image pickup section 14 will output the signals of desirable color balance. Because signal charges are attainable with the cells 14a for the color G, the previously stated electronic camera can perform accurate photometry in the AE mode or the AF mode for outputting luminance information.

In summary, in accordance with the present invention, a solid-state image pickup apparatus combines signals output from different groups of photosensitive cells each having a particular degree of sensitivity and thereby realizes brightness up to ten times as high as brightness at which the cells with high-sensitivity saturate. The apparatus therefore successfully broadens a dynamic range. The photosensitive cells are arranged in a honeycomb pattern at the same aperture pitch in both of the horizontal and vertical directions with consideration also given to the configuration of the individual cell. This guarantees the spatial isotropy of the arrangement of the photosensitive cells. As for the combination of the signals, the influence of irregularity in saturation on the photosensitive cells with high-sensitivity is reduced. The difference in sensitivity can be implemented not only by the individual photosensitive cell but also by microlenses or color filters each transmitting a particular quantity of light therethrough. This allows the photosensitive cells to be produced by a simple and easy procedure.

While the present invention has been described with reference to the illustrative embodiments, it is not to be restricted by the embodiments. It is to be appreciated that those skilled in the art can change or modify the embodiments without departing from the scope and spirit of the present invention.

The entire disclosure of Japanese patent application No. 289052/1998 filed Oct. 12, 1998 including the specification, claims, accompanying drawings and abstract of the disclosure is incorporated herein by reference in its entirety.

What is claimed is:

1. A solid-state image pickup apparatus comprising:

different kinds of color filters for separating incident light representative of a scene into color components;

a plurality of photosensitive cells arranged in rows and columns each for receiving a particular one of the color components and outputting a corresponding signal charge;

said plurality of photosensitive cells being classified into a first group having first preselected sensitivity and a second group having second preselected sensitivity lower than said first sensitivity;

said photosensitive cells of the first group adjoining said photosensitive cells of the second group and having geometric centers shifted from geometric centers of said photosensitive cells of said second group by one half of a pitch with respect to arrangement in a direction of rows and/or a direction of columns;

a first transfer path extending in the direction of columns between each nearby photosensitive cells of the first group adjoining each other in the direction of rows, and having a greater width than a usual width for transferring signal charges output from said photosensitive cells in accordance with said first sensitivity;

a second transfer path extending in the direction of columns between each nearby photosensitive cells of the second group adjoining each other in the direction of rows, and having a narrower width than the usual width for transferring signal charges output from said photosensitive cells in accordance with said second sensitivity;

a signal reading circuit for feeding the signal charges to said first transfer path and said second transfer path;

a third transfer path extending in a direction of rows for transferring the signal charges input via said first transfer path and said second transfer path; and a signal combining circuit for adjusting a saturation level of signals derived from said photosensitive cells of the first group and then combining said signals and signals derived from said photosensitive cells of the second group.

2. An apparatus in accordance with claim 1, wherein said photosensitive cells of the second group have a sensitive range narrower than at least a sensitive range of said photosensitive cells of the first group.

3. An apparatus in accordance with claim 1, further comprising a plurality of light conducting members each being positioned in front of a particular one of said photoconductive cells of the first group and said photoconductive cells of the second group in a direction of light incidence for conducting incident light to a respective photoconductive cell, wherein said light conductive members assigned to said photoconductive cells of the second group each have an aperture area smaller than an aperture area of said light conductive members assigned to said photosensitive cells of the first group.

4. An apparatus in accordance with claim 1, further comprising condensing lenses positioned in front of said photosensitive cells of the first group in a direction of light incidence for condensing light incident to said condensing lenses.

5. An apparatus in accordance with claim 1, further comprising condensing lenses positioned in front of said photosensitive cells of the first group and said photosensitive cells of the second group in a direction of light incidence, wherein said condensing lenses assigned to said photosensitive cells of the second group are different in configuration from said condensing lenses assigned to said photosensitive cells of the first group such that a condensing ratio of light to be incident to said photosensitive cells of the second group is reduced.

6. An apparatus in accordance with claim 5, wherein the configuration of said condensing lenses is defined by a radius of curvature of a condensing surface or a cross-sectional area over which incident light is transmitted.

7. An apparatus in accordance with claim 1, wherein said color filters assigned to said photosensitive cells of the second group have a dimming function for reducing light to transmit.

8. An apparatus in accordance with claim 7, wherein said color filters assigned to said photoconductive cells of the second group comprise color filters greater in film thickness or darker than color filters associated with said photosensitive cells of the first group.

9. An apparatus in accordance with claim 1, wherein said color filters comprises color filters arranged in a same pattern over both of said photosensitive cells of the first group and said photosensitive cells of the second group.

10. An apparatus in accordance with claim 1, wherein said color filters comprise color filters of primary colors assigned to said photosensitive cells of the first group and color filters of a primary color assigned to said photosensitive cells of the second group and capable of producing only luminance information.

11. An apparatus in accordance with claim 1, wherein said third transfer path comprises a fourth transfer path and a fifth transfer path to which outputs of said photosensitive cells of the first group and outputs of said photosensitive cells of the second group, respectively, are output at a time, said apparatus further comprising a signal skipping circuit for causing the signal charges to skip from said fourth transfer path to said fifth transfer path.

12. An apparatus in accordance with claim 11, wherein said signal combining circuit comprises:

a first and a second amplifying circuit for respectively amplifying an output of said fourth transfer path and an output of said fifth transfer path; and a line combining circuit for adding an output of said first amplifying circuit and an output of said second amplifying circuit on a line basis;

said first amplifying circuit including a level clipping circuit for slicing the output of said fourth transfer path at a preselected signal level.

13. An apparatus in accordance with claim 1, wherein said signal combining circuit comprises:

a selecting section for outputting, on a pixel basis, signals output from said photosensitive cells of the first group and signals output from said photosensitive cells of the second group;

a level clipping circuit for slicing, among signals output from said selecting section, the signals derived from said photosensitive cells of the first group at a preselected signal level; and a pixel combining circuit for adding outputs of said level clipping circuit and, among the signals output from said selecting section, the signals derived from said photosensitive cells of the second group.

14. An apparatus in accordance with claim 1, wherein a preselected signal level is set on said third transfer path, said apparatus further comprising a sweeping circuit for sweeping signals on said third transfer path above said preselected signal level, said third transfer path effecting delivery of signals to said sweeping circuit in accordance with a potential of a drive signal fed to said third transfer path.

15. An apparatus in accordance with claim 1, wherein said photosensitive cells of the second group saturate with a signal charge lower in level than a signal charge with which said photosensitive cells of the first group saturate.

16. A signal reading method of reading signal charges output by photoelectric transduction from photosensitive cells of a first group and photosensitive cells of a second group each having particular sensitivity via a first and a second transfer path extending in a direction of columns and a third transfer path extending in a direction of rows, said photosensitive cells being arranged bidimensionally with geometrical centers thereof being shifted by one half of a pitch representative of a distance between said photosensitive cells in at least one of said direction of columns and said direction of rows, said signal reading method comprising the steps of:

(a) causing each of said photosensitive cells of the first group and said photosensitive cells of the second group to receive light with a particular one of high sensitivity and low sensitivity;

(b) feeding signal charges of high sensitivity and signal charges of low sensitivity produced in said step (a) to said first transfer path and said second transfer path, respectively;

(c) sequentially transferring the signal charges of high sensitivity and the signal charges of low sensitivity to said third transfer path in the direction of columns;

(d) transferring the signal charges input to said third transfer path in the direction of rows in a form of a line or in a form of pixels corresponding to said photosensitive cells;

(e) selecting line by line or pixel by pixel a particular destination of the fed signal charges for each of the high-sensitivity and the low-sensitivity;

(f) slicing, when the signal charges of high sensitivity selected in said step (e) are higher than a preselected level, said signal charges at said preselected level; and (g) combining signals output in said step (f) and the signal charges of low sensitivity selected in said step (e).

17. A signal reading method in accordance with claim 16, wherein said step (a) comprises controlling an exposure time in accordance with the sensitivity.

18. A signal reading method in accordance with claim 16, wherein said third transfer path comprises a fourth and a fifth transfer path, said step (d) comprising:

(h) feeding the signal charges to said fourth transfer path;

(i) causing the signal charges fed to said fourth transfer path to skip to said fifth transfer path;

(j) feeding new signal charges to said fourth transfer path; and (k) outputting the signal charges fed in said steps (i) and (j) at the same time.

19. A signal reading method in accordance with claim 16, wherein said step (f) comprises:

(h) controlling, after the signal charges of high sensitivity have been fed to said third transfer path, a drive signal for maintaining an amount of signal charge on said third transfer path below a preselected amount; and (i) controlling said control signal for restoring the amount of signal charge on said third transfer path to an original amount;

said step (g) comprising holding the signal charges fed in said step (h) and the signal charges fed in said step (i) at respective positions and then outputting said signals charges from said third transfer path.

20. A signal reading method in accordance with claim 16, wherein outputs produced in said step (g) are reduced in the direction of rows with the signal charges of low sensitivity being paired.

* * * * *